United States Patent
Yamawaku et al.

(10) Patent No.: US 8,523,428 B2
(45) Date of Patent: Sep. 3, 2013

(54) COMPONENT IN PROCESSING CHAMBER OF SUBSTRATE PROCESSING APPARATUS AND METHOD OF MEASURING TEMPERATURE OF THE COMPONENT

(75) Inventors: Jun Yamawaku, Nirasaki (JP); Chishio Koshimizu, Nirasaki (JP); Tatsuo Matsudo, Nirasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 13/432,617

(22) Filed: Mar. 28, 2012

(65) Prior Publication Data

US 2012/0251759 A1 Oct. 4, 2012

Related U.S. Application Data

(60) Provisional application No. 61/472,688, filed on Apr. 7, 2011.

(30) Foreign Application Priority Data

Mar. 28, 2011 (JP) ................... 2011-069838

(51) Int. Cl.
*G01K 13/00* (2006.01)
(52) U.S. Cl.
USPC .......................................... 374/141; 374/130
(58) Field of Classification Search
USPC ................................................. 374/130, 141
See application file for complete search history.

(56) References Cited

U.S. PATENT DOCUMENTS

| | | | | |
|---|---|---|---|---|
| 6,126,744 | A * | 10/2000 | Hawkins et al. | 117/85 |
| 6,171,644 | B1 * | 1/2001 | Jinno et al. | 427/79 |
| 2005/0109276 | A1 * | 5/2005 | Iyer et al. | 118/715 |
| 2005/0259716 | A1 * | 11/2005 | Ito et al. | 374/161 |
| 2009/0147819 | A1 * | 6/2009 | Goodman et al. | 374/1 |
| 2010/0206482 | A1 * | 8/2010 | Matsudo et al. | 156/345.27 |
| 2012/0031330 | A1 * | 2/2012 | Tsumori et al. | 118/708 |

FOREIGN PATENT DOCUMENTS

| | | |
|---|---|---|
| JP | 2003-307458 | 10/2003 |
| JP | 2008-227063 | 9/2008 |

* cited by examiner

*Primary Examiner* — Mirellys Jagan
(74) *Attorney, Agent, or Firm* — Cantor Colburn LLP

(57) ABSTRACT

A component in a processing chamber of a substrate processing apparatus, where a temperature may be accurately measured by using a temperature measuring apparatus using an interference of a low-coherence light, even when a front surface and a rear surface are not parallel due to abrasion, or the like. A focus ring used in a vacuum atmosphere and of which a temperature is measured includes an abrasive surface exposed to an abrasive atmosphere according to plasma, a nonabrasive surface not exposed to the abrasive atmosphere, a thin-walled portion including a top surface and a bottom surface that are parallel to each other, and a coating member coating the top surface of the thin-walled portion, wherein a mirror-like finishing is performed on each of the top and bottom surfaces of the thin-walled portion.

14 Claims, 15 Drawing Sheets

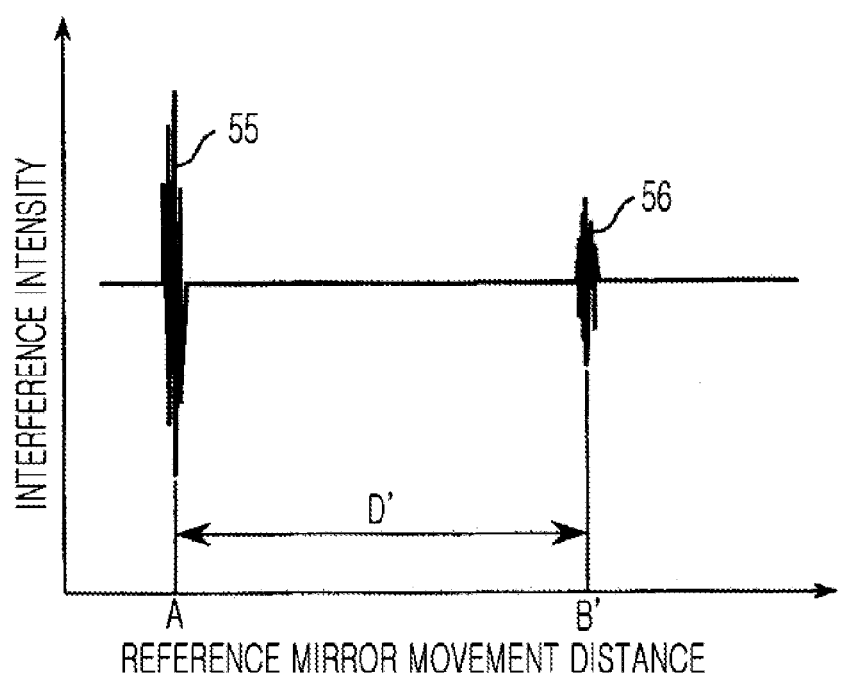

COMPONENT IN PROCESSING CHAMBER OF SUBSTRATE PROCESSING APPARATUS AND METHOD OF MEASURING TEMPERATURE OF THE COMPONENT

CROSS-REFERENCE TO RELATED PATENT APPLICATIONS

This application claims the benefit of Japanese Patent Application No. 2011-069838 filed on Mar. 28, 2011, in the Japan Patent Office and U.S. patent Application Ser. No. 61/472,688 filed on Apr. 7, 2011, in the United States Patent Trademark Office, the disclosure of which are incorporated herein in their entireties by reference.

BACKGROUND OF THE INVENTION

1. Field of the Invention

The present invention relates to a component in a processing chamber of a substrate processing apparatus, and a method of measuring a temperature of the component.

2. Description of the Related Art

In a substrate processing apparatus for performing a predetermined plasma process on a wafer constituting a substrate by using plasma generated in a processing chamber, members disposed in the processing chamber are worn away by the plasma. Specifically, an abrasion loss of a focus ring disposed to surround the wafer and formed of the same material as the wafer is high as the focus ring is exposed to plasma having relatively high density. Since a distribution of plasma on the wafer changes when the focus ring is worn away, the focus ring needs to be replaced when the abrasion loss of the focus ring exceeds a predetermined amount while monitoring the abrasion loss.

Also, conventionally, when various processes, such as a plasma process, are performed on the wafer, temperatures of the wafer and each component in the processing chamber are measured and controlled so as to promote certainty of a process. In addition, recently, technologies about a temperature measuring method that measures a temperature of a focus ring by using a low-coherence light interference thermometer have been suggested (for example, refer to Patent References 1 and 2). The low-coherence light interference thermometer measures a temperature of a target by irradiating a low-coherence light toward a rear surface of the temperature measured target, for example, a focus ring, and measuring interference between a reference light and reflection lights from a front surface and the rear surface.

However, in a temperature measuring technology using a low-coherence light interference thermometer, a measured target should satisfy requirements, such as allowing a part of a measurement light to penetrate therethrough, having a high degree of parallelization of a front surface and a rear surface at a measurement portion, and having a mirror-like finished front surface and rear surface. Accordingly, when the measured target is worn away by plasma and the degree of parallelization of the surface and rear surface is no longer maintained, requirements of the measured target are not satisfied, and thus a temperature cannot be accurately measured.

Also, conventional suggestions about a temperature measuring technology using a low-coherence light interference thermometer are mainly about improving a low-coherence light interference thermometer, and studies about making a measured target suitable for temperature measurement using a low-coherence light interference thermometer have not been performed.

(Patent Document 1) Japanese Laid-Open Patent Publication No. 2008-227063
(Patent Document 2) Japanese Laid-Open Patent Publication No. 2003-307458

SUMMARY OF THE INVENTION

The present invention provides a component in a processing chamber of a substrate processing apparatus and a method of measuring a temperature of the component, where a temperature is accurately measured by using a temperature measuring apparatus using an interference of a low-coherence light, even when a front surface and a rear surface are not parallel due to abrasion, or the like.

According to an aspect of the present invention, there is provided a component in a processing chamber of a substrate processing apparatus, wherein a temperature of the component is measured, the component including: an abrasive surface which is exposed to an abrasive atmosphere and a nonabrasive surface which is not exposed to the abrasive atmosphere; a temperature measured portion including a surface at the abrasive surface side and a surface at the nonabrasive surface side, which are parallel to each other; and a coating portion which coats the surface of the temperature measured portion at the abrasive surface side.

The temperature measured portion may be a thin-walled portion corresponding to a concave portion formed on the abrasive surface, and a mirror-like finishing may be performed on each of a surface of the thin-walled portion at the abrasive surface side and a surface of the thin-walled portion at the nonabrasive surface side.

A surface roughening process may be performed on a surface of the coating portion facing the surface of the thin-walled portion at the abrasive surface side.

A heat transfer sheet or a heat transfer gas may be disposed at a contact portion of the coating portion and an inner surface of the concave portion.

The coating portion may be formed of any one of silicon (Si), silicon carbide (SiC), quartz, sapphire, ceramic, alumina ($Al_2O_3$), and aluminum nitride (AlN).

The temperature measured portion may be a temperature measured member inserted to a concave portion formed on the nonabrasive surface of the component in the processing chamber of the substrate processing apparatus, wherein a mirror-like finishing may be performed on each of a surface of the temperature measured member at the abrasive surface side and a surface of the temperature measured member at the nonabrasive surface side.

A surface roughening process may be performed on an inner surface of the concave portion facing the surface of the temperature measured member at the abrasive surface side.

A heat transfer sheet or a heat transfer gas may be disposed at a contact portion of the temperature measured member and the inner surface of the concave portion.

The temperature measured member may be formed of silicon (Si), quartz, or sapphire.

The temperature measured portion may be a part of the component in the processing chamber of the substrate processing apparatus, a mirror-like finishing may be performed on each of the surface at the abrasive surface side and the surface at the nonabrasive surface side with respect to the part of the component in the processing chamber of the substrate processing apparatus, and the surface at the abrasive surface side, on which the mirror-like finishing is performed, may be covered by the coating portion.

The temperature measured portion may be a temperature measured member engaged to a cut-out portion formed on the nonabrasive surface of the component in the processing chamber of the substrate processing apparatus, a mirror-like finishing may be performed on each of the surface of the temperature measured member at the abrasive surface side and the surface of the temperature measured member at the nonabrasive surface side, and the surface of the temperature measured member at the abrasive surface side may be covered by a part forming the cut-out portion of the component in the processing chamber of the substrate processing apparatus.

The temperature measured portion may be a temperature measured member attached to the nonabrasive surface of the component in the processing chamber of the substrate processing apparatus, a mirror-like finishing may be performed on each of the surface of the temperature measured member at the abrasive surface side and the surface of the temperature measured member at the nonabrasive surface side, and the surface of the temperature measured member at the abrasive surface side may be covered by the component in the processing chamber of the substrate processing apparatus.

The temperature measured member may have a stepped portion including a thick plate portion and a thin plate portion, a surface of the thin plate portion at the abrasive surface side and a surface of the thin plate portion at the nonabrasive surface side may be parallel to each other, a mirror-like finishing may be performed on each of the surfaces of the thin plate portion, and the surface of the thin plate portion at the abrasive surface side may be covered by a part of the component in the processing chamber of the substrate processing apparatus.

The temperature measured member may include a stepped portion including a thick plate portion and a thin plate portion, a surface of the thick plate portion at the abrasive surface side and a surface of the thick plate portion at the nonabrasive surface side may be parallel to each other, a mirror-like finishing may be performed on each of the surfaces of the thick plate portion, and the surface of the thick plate portion at the abrasive surface side may be covered by a part of the component in the processing chamber of the substrate processing apparatus.

The component in the processing chamber of the substrate processing apparatus may be any one of a focus ring, an upper electrode, a lower electrode, an electrode protecting member, an insulator, an insulation ring, an observation window, a bellows cover, a baffle plate, and a deposhield.

According to another aspect of the present invention, there is provided a method of measuring a temperature of a component in a processing chamber of a substrate processing apparatus by using an interference of a low-coherence light, the method including: irradiating a measurement light to a surface of a temperature measured portion at a nonabrasive surface side, wherein the temperature measured portion is formed in the component in the processing chamber of the substrate processing apparatus, the component including an abrasive surface exposed to an abrasive atmosphere and the nonabrasive surface not exposed to the abrasive atmosphere, a surface of the temperature measured portion at the abrasive surface side and the surface of the temperature measured portion at the nonabrasive surface side are parallel to each other, and the surface of the temperature measured portion at the abrasive surface side is covered by a coating portion; receiving a reflection light of the measurement light reflected from the surface of the temperature measured portion at the nonabrasive surface side, and a reflection light of the measurement light reflected from the surface of the temperature measured portion at the abrasive surface side; detecting an optical path length difference between the two received reflection lights; and calculating a temperature of the temperature measured portion based on the detected optical path length difference and a pre-obtained relationship between the optical path length difference and a temperature of the temperature measured portion.

The temperature measured portion may be a thin-walled portion corresponding to a concave portion formed on the abrasive surface of the component in the processing chamber of the substrate processing apparatus, and a mirror-like finishing may be performed on each of a surface of the thin-walled portion at the abrasive surface side and a surface of the thin-walled portion at the nonabrasive surface side.

A surface roughening process may be performed on a surface of the coating portion facing the surface of the thin-walled portion at the abrasive surface side.

A heat transfer sheet or a heat transfer gas may be disposed at a contact portion of the coating portion and an inner surface of the concave portion.

The coating portion may be formed of any one of silicon (Si), silicon carbide (SiC), quartz, sapphire, ceramic, alumina ($Al_2O_3$), and aluminum nitride (AlN).

The temperature measured portion may be a temperature measured member inserted to a concave portion formed on the nonabrasive surface of the component in the processing chamber of the substrate processing apparatus, and a mirror-like finishing may be performed on each of a surface of the temperature measured member at the abrasive surface side and a surface of the temperature measured member at the nonabrasive surface side.

A surface roughing process may be performed on an inner surface of the concave portion facing the surface of the temperature measured member at the abrasive surface side.

A heat transfer sheet or a heat transfer gas may be disposed at a contact portion of the temperature measured member and the inner surface of the concave portion.

The temperature measured member may be formed of silicon (Si), quartz, or sapphire.

The component in the processing chamber of the substrate processing apparatus may be any one of a focus ring, an upper electrode, a lower electrode, an electrode protecting member, an insulator, an insulation ring, an observation window, a bellows cover, a baffle plate, and a deposhield.

BRIEF DESCRIPTION OF THE DRAWINGS

The above and other features and advantages of the present invention will become more apparent by describing in detail exemplary embodiments thereof with reference to the attached drawings in which:

FIGS. 4A and 4B are graphs showing interference waveforms between a reflection light from a temperature measured portion of a focus ring detected by a photo detector (PD) of FIG. 3, and a reflection light from a reference mirror, where FIG. 4A shows interference waveforms obtained before a temperature change of the focus ring and FIG. 4B shows interference waveforms obtained after the temperature change of the focus ring;

FIGS. 5A through 5C are views schematically showing a configuration of a focus ring according to a first embodiment of the present invention, wherein FIG. 5A is a plan view, FIG. 5B is a cross-sectional view taken along a line A-A of FIG. 5A, and FIG. 5C is a cross-sectional view of a coating member inserted into a thin-walled portion;

DETAILED DESCRIPTION OF THE INVENTION

Hereinafter, embodiments of the present invention will be described with reference to accompanying drawings.

First, a substrate processing apparatus to which a component in a processing chamber, according to an embodiment of the present invention, is applied will be described.

Figure 1:
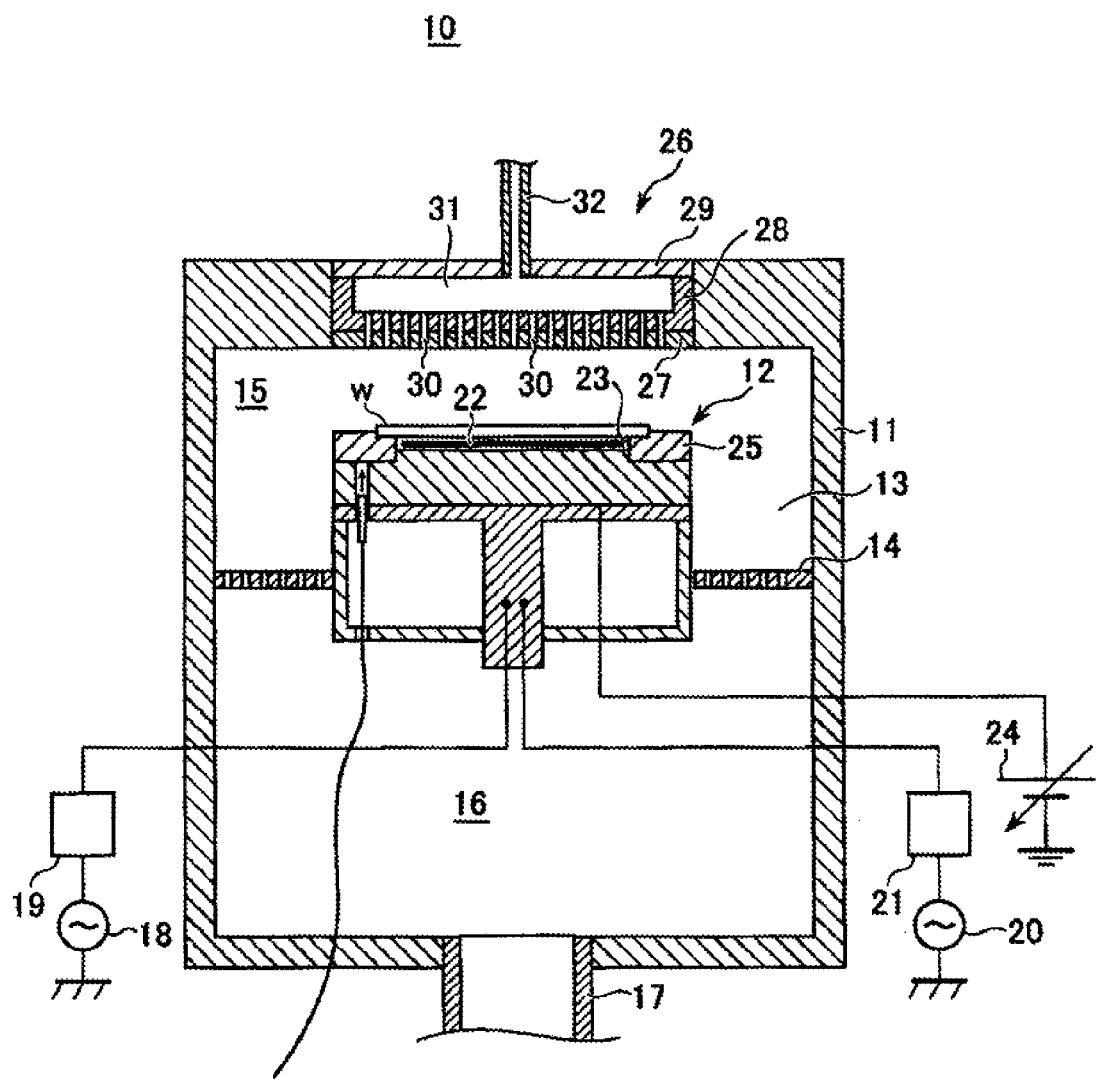
FIG. 1 is a cross-sectional view schematically showing a configuration of a substrate processing apparatus to which a component in a processing chamber, according to an embodiment of the present invention, is applied.

FIG. 1 is a cross-sectional view schematically showing a configuration of a substrate processing apparatus 10 to which a component in a processing chamber 15, according to an embodiment of the present invention, is applied. The substrate processing apparatus 10 performs a plasma etching process on a wafer for forming semiconductor devices (hereinafter, simply referred to as "wafer") as a substrate.

Referring to FIG. 1, the substrate processing apparatus 10 includes a chamber 11 for receiving a wafer W having a diameter of, for example, 300 mm, and a susceptor 12 formed as a cylinder on which the wafer W for semiconductor devices is placed is disposed in the chamber 11. In the substrate processing apparatus 10, a side exhaust passage 13 is formed by an inner side wall of the chamber 11 and a side surface of the susceptor 12. An exhaust plate 14 is disposed at an intermediate portion of the side exhaust passage 13.

The exhaust plate 14 is formed as a plate-shaped member having a plurality of through-holes, and functions as a partition plate that divides an inside of the chamber 11 into an upper portion and a lower portion. Plasma is generated in the upper portion (hereinafter, referred to as a "processing chamber 15") of the chamber 11, which is divided by the exhaust plate 14, as will be described later. In addition, an exhaust pipe 17 for discharging a gas in the chamber 11 is connected to the lower portion (hereinafter, referred to as an "exhaust chamber (manifold) 16") in the chamber 11. The exhaust plate 14 captures or reflects plasma generated in the processing chamber 15 to prevent the plasma from leaking to the manifold 16.

A turbo molecular pump (TMP) and a dry pump (DP) (both not shown) are connected to the exhaust pipe 17, and the TMP and the DP depressurize the inside of the chamber 11 through a vacuum suction. In more detail, the DP depressurizes the inside of the chamber 11 from atmospheric pressure to a medium vacuum state (for example, less than or equal to $1.3 \times 10$ Pa (0.1 Torr)), and the TMP depressurizes the inside of the chamber 11 to a high vacuum state (for example, less than or equal to $1.3 \times 10^{-3}$ Pa ($1.0 \times 10^{-5}$ Torr)) that is at a lower pressure than the medium vacuum state, in cooperation with the DP. In addition, the pressure in the chamber 11 is controlled by an automatic pressure control (APC) valve (not shown).

A first high frequency power source 18 is connected to the susceptor 12 in the chamber 11 via a first matcher 19 and a second high frequency power source 20 is connected to the susceptor 12 via a second matcher 21. The first high frequency power source 18 applies a high frequency power of a relatively low frequency, for example, 2 MHz, to the susceptor 12 for ion implantation, and the second high frequency power source 20 applies a high frequency power of a relatively high frequency, for example, 60 MHz, to the susceptor 12 for generating plasma. Accordingly, the susceptor 12 operates as an electrode. In addition, the first matcher 19 and the second matcher 21 reduce reflection of the high frequency powers by the susceptor 12, thereby increasing efficiency of applying the high frequency powers to the susceptor 12.

An upper portion of the susceptor 12 has a shape wherein a circumference having a relatively small diameter protrudes along a concentric axis from a leading end of a circumference having a relatively large diameter, and a step is formed on the upper portion to surround the circumference having the relatively small diameter. An electrostatic chuck 23 formed of ceramic and including an electrostatic electrode plate 22 therein is disposed on a leading end of the circumference having the relatively small diameter. A direct current power source 24 is connected to the electrostatic electrode plate 22. When a positive direct current voltage is applied to the electrostatic electrode plate 22, negative electric potential is generated on a surface of the wafer W at the electrostatic chuck 23 side (hereinafter, referred to as a "rear surface"), and thus an electric field is generated between the electrostatic electrode plate 22 and the rear surface of the wafer W. Then, the wafer W is adhered and held against the electrostatic chuck 23 by Coulomb force or Johnson-Rahbek force caused by the electric field.

In addition, on an upper portion of the susceptor 12, a focus ring 25 (the component in the processing chamber) is placed on the step of the susceptor 12 so as to surround the wafer W adhered by and held against the electrostatic chuck 23. The focus ring 25 is formed of, for example, silicon (Si).

The focus ring 25 is an annular shaped member, and includes a top surface 25a (abrasive surface) exposed inside the processing chamber 15, and a bottom surface 25b (nonabrasive surface) facing the step of the susceptor 12. Also, the focus ring 25 includes a thin-walled portion 25T as a temperature measured portion (refer to FIG. 5 described below). A surface (hereinafter, referred to as a "top surface") 25Ta of the thin-walled portion 25T at the abrasive surface side and a surface (hereinafter, referred to as a "bottom surface") 25Tb of the thin-walled portion 25T at the nonabrasive surface side are parallel to each other.

A shower head 26 is disposed at a ceiling portion of the chamber 11 to face the susceptor 12. The shower head 26 includes an upper electrode plate 27, a cooling plate 28 that detachably hangs and supports the upper electrode plate 27, and a lid 29 covering the cooling plate 28. The upper electrode plate 27 is a disc shaped member having a plurality of gas holes 30 penetrating through the upper electrode plate 27 in a thickness direction, and is formed of silicon constituting a semiconductor.

A buffer chamber 31 is formed inside the cooling plate 28, and a processing gas introducing pipe 32 is connected to the buffer chamber 31.

In the substrate processing apparatus 10, a processing gas that is supplied into the buffer chamber 31 through the processing gas introducing pipe 32 is introduced into the inner space of the processing chamber 15 via the gas holes 30. The introduced processing gas is excited by the high frequency power for generating plasma, which is applied in the inner space of the processing chamber 15 via the susceptor 12 from the second high frequency power source 20, and becomes plasma. Ions in the plasma are attracted by the high frequency power for ion implantation, which is applied from the first high frequency power source 18 to the susceptor 12, toward the wafer W, and then a plasma etching process is performed on the wafer W. Here, the ions in the plasma also reach and sputter the top surface 25a of the focus ring 25 or a bottom surface of the upper electrode plate 27.

Figure 2:
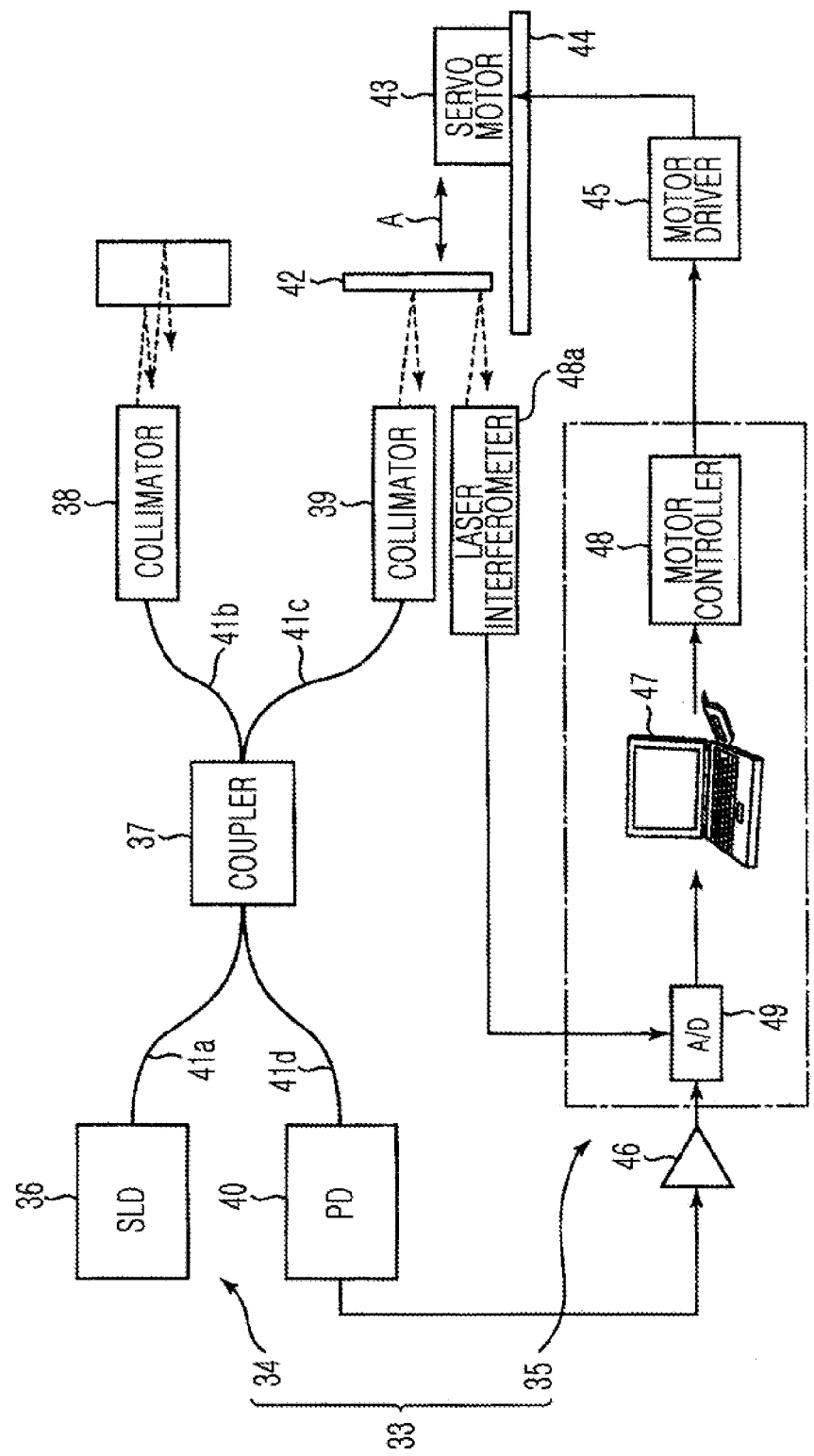
FIG. 2 is a block diagram schematically showing a configuration of a member temperature measuring apparatus included in the substrate processing apparatus of FIG. 1.

Such a substrate processing apparatus 10 includes a member temperature measuring apparatus so as to measure a temperature of a component in the processing chamber, such as the focus ring 25. FIG. 2 is a block diagram schematically showing a configuration of a member temperature measuring apparatus 33 included in the substrate processing apparatus 10 of FIG. 1. Hereinafter, the member temperature measuring apparatus 33 included in the substrate processing apparatus 10, and a temperature measuring method using a low-coherence light performed by the member temperature measuring apparatus 33 are described with reference to FIGS. 2 through 4, but the member temperature measuring apparatus 33 and the temperature measuring method are only examples, and are not limited thereto.

Referring to FIG. 2, the member temperature measuring apparatus 33 includes a low-coherence light optical system 34 that irradiates a low-coherence light, for example, to the focus ring 25 in the substrate processing apparatus 10, and receives a reflection light of the low-coherence light, and a temperature calculating apparatus 35 that calculates a temperature of the focus ring 25 based on the reflection light received by the low-coherence light optical system 34. A low-coherence light is a light where it is difficult for wave trains of at least two lights divided from a light irradiated from one light source to overlap as the at least two lights travel relatively far (it is difficult for the at least two lights to interfere with each other), and has a relatively short coherence distance (coherence length).

The low-coherence light optical system 34 includes a super luminescent diode (SLD) 36 as a low-coherence light source, an optical fiber fusion coupler (hereinafter, simply referred to as a "coupler") 37 operating as a 2×2 splitter connected to the SLD 36, collimators 38 and 39 connected to the coupler 37, a photo detector (PD) 40 as a light-receiving device connected to the coupler 37, and optical fibers 41a, 41b, 41c, and 41d connecting each component.

The SLD 36 irradiates, for example, a low-coherence light having a center wavelength of 1.55 μm or 1.31 μm and a coherence length of 50 μm, at a maximum output of 1.5 mW. The coupler 37 divides the low-coherence light from the SLD 36 into two low-coherence lights, and transmits the two low-coherence lights respectively to the collimators 38 and 39 through the optical fibers 41b and 41c. The collimators 38 and 39 are respectively a collimator that irradiates the two low-coherence lights (a measurement light 50 and a reference light 51 described below), which are divided by the coupler 37, perpendicularly to the bottom surface 25Tb of the thin-walled portion 25T constituting the temperature measured member of the focus ring 25, and a collimator that irradiates the two low-coherence lights perpendicularly to a reflection surface of a reference mirror 42 described below. Also, the PD 40 is formed of, for example, a germanium (Ge) photo diode.

The low-coherence light optical system 34 includes the reference mirror 42 disposed in front of the collimator 39, a reference mirror driving stage 44 for horizontally moving the reference mirror 42 by using a servo motor 43 so as to follow an irradiation direction of the low-coherence light from the collimator 39, a motor driver 45 for driving the servo motor 43 of the reference mirror driving stage 44, and an amplifier 46 for amplifying an output signal from the PD 40 by being connected to the PD 40. The reference mirror 42 may be a corner cube prism or plane mirror having a reflection surface.

The collimator 38 is embedded in the susceptor 12 to face the bottom surface 25Tb of the thin-walled portion 25T with respect to the focus ring 25, and irradiates the low-coherence light (the measurement light 50 described below) obtained through the coupler 37 to the bottom surface 25Tb of the thin-walled portion 25T while receiving reflection lights (a reflection light 52b and a reflection light 52a described below) of the low-coherence lights from the bottom and top surfaces 25Tb and 25Ta of the thin-walled portion 25T and transmitting the reflection lights to the PD 40.

The collimator 39 irradiates the low-coherence light (the reference light 51 described below) obtained by the coupler 37 to the reference mirror 42 while receiving a reflection light (a reflection light 54 described below) of the low-coherence light from the reference mirror 42 and transmitting the reflection light to the PD 40.

The reference mirror driving stage 44 horizontally moves the reference mirror 42 in a direction indicated by an arrow A shown in FIG. 2, such that the reflection surface of the reference mirror 42 is always perpendicular to an irradiated light from the collimator 39. The reference mirror 42 may move back and forth along the direction indicated by the arrow A. Also, in FIG. 2, the irradiated light from the collimator 39 and the reflection light from the reference mirror 42 are shown to each have a predetermined direction angle so as not to overlap each other for convenience of description, but needless to say, they actually overlap each other without having the predetermined direction angle. The same is applied to the collimator 38 or a laser interferometer 48a described below.

The temperature calculating apparatus 35 includes a personal computer (PC) 47 that controls the entire temperature calculating apparatus 35, a motor controller 48 that controls the servo motor 43 for moving the reference mirror 42 via the motor driver 45, and an analog/digital (ND) converter 49 that performs an analog-to-digital conversion by being synchronized to a control signal from the laser interferometer 48a. Here, if a distance of the reference mirror 42 is accurately measured by the laser interferometer 48a or a linear scale (not shown), the ND converter 49 performs an ND conversion on an output signal of the PD 40 via the amplifier 46 of the low-coherence light optical system 34 by being synchronized to a control signal according to a moving distance measured by the laser interferometer 48a or the linear scale, thereby measuring a temperature at a high precision.

Figure 3:
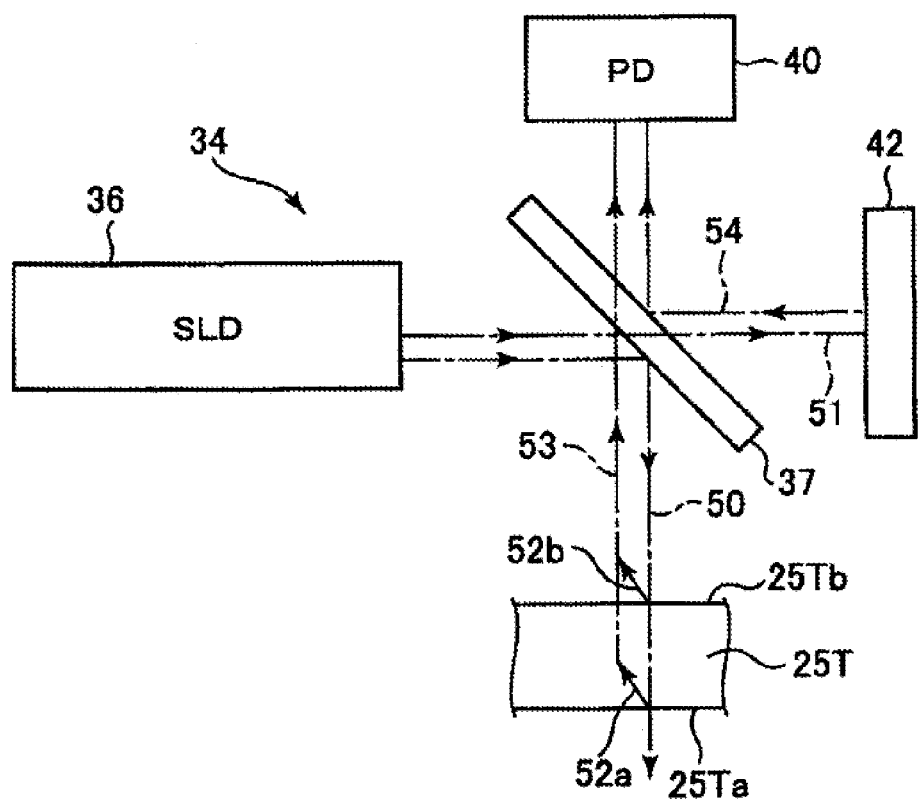
FIG. 3 is a diagram for describing a temperature measuring operation of a low-coherence light optical system of FIG. 2.

FIG. 3 is a diagram for describing a temperature measuring operation of the low-coherence light optical system 34 of FIG. 2.

The low-coherence light optical system 34 is an optical system using a low-coherence interferometer having a Michelson interferometer as a basic structure. As shown in FIG. 3, a low-coherence light irradiated from the SLD 36 is split into the measurement light 50 and the reference light 51 by the coupler 37 operating as a splitter, wherein the measurement light 50 is irradiated toward the thin-walled portion 25T of the focus ring 25 constituting a measured target, and the reference light 51 is irradiated toward the reference mirror 42.

The measurement light 50 irradiated to the thin-walled portion 25T of the focus ring 25 is reflected at each of the bottom surface 25Tb and the top surface 25Ta of the thin-walled portion 25T, and the reflection light 52b from the bottom surface 25Tb of the thin-walled portion 25T and the reflection light 52a from the top surface 25Ta of the thin-walled portion 25T are incident on the coupler 37 through an same optical path 53. Also, the reference light 51 irradiated to the reference mirror 42 is reflected at the reflective surface, and the reflection light 54 from the reflection surface is also incident on the coupler 37. Here, as described above, since the reference mirror 42 moves horizontally according to the irradiation direction of the reference light 51, the low-coherence light optical system 34 may change optical path lengths of the reference light 51 and the reflection light 54.

The reflection light 52b and the reflection light 54 interfere with each other when the optical path lengths of the reference light 51 and the reflection light 54 are changed such that optical path lengths of the measurement light 50 and the reflection light 52b are the same as the optical path lengths of the reference light 51 and the reflection light 54. Also, the reflection light 52a and the reflection light 54 interfere with each other when the optical path lengths of the measurement light 50 and the reflection light 52a are the same as the optical path lengths of the reference light 51 and the reflection light 54. Such interference is detected by the PD 40. Upon detecting the interference, the PD 40 outputs a signal.

Figure 4A:
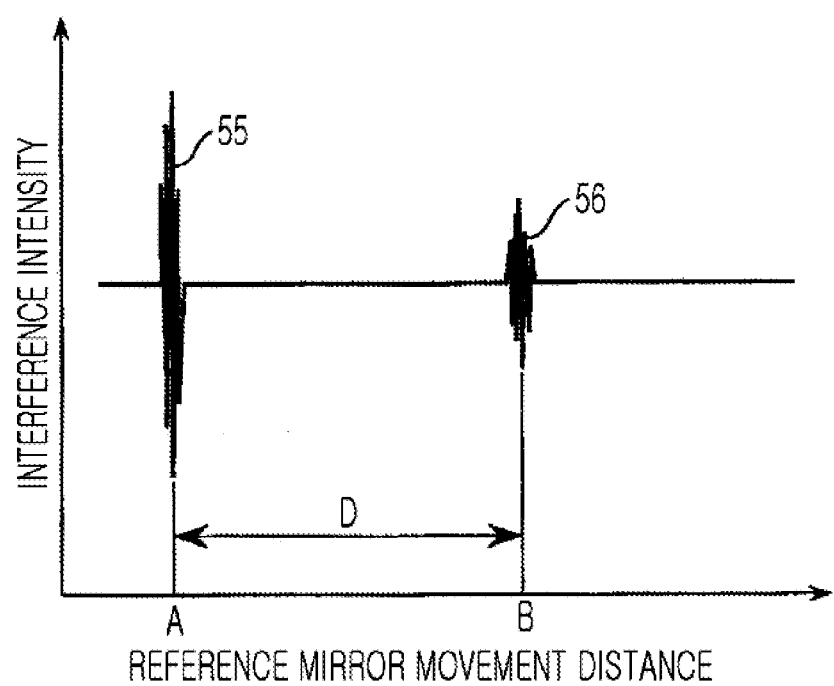

FIGS. 4A and 4B are graphs showing interference waveforms between a reflection light from the thin-walled portion 25T (the temperature measured portion) of the focus ring 25 detected by the PD 40 of FIG. 3, and a reflection light from the reference mirror 42, where FIG. 4A shows interference waveforms obtained before a temperature change of the focus ring 25 and FIG. 4B shows interference waveforms obtained after the temperature change of the focus ring 25. Also, a vertical axis denotes interference intensity and a horizontal axis denotes a distance of the reference mirror 42 horizontally moved from a predetermined starting point (hereinafter, simply referred to as a "reference mirror movement distance").

As shown in the graph of FIG. 4A, when the reflection light 54 from the reference mirror 42 interferes with the reflection light 52b from the bottom surface 25Tb of the thin-walled portion 25T of the focus ring 25, for example, an interference waveform 55 based on an interference location A is detected. Also, when the reflection light 54 from the reference mirror 42 interferes with the reflection light 52a from the top surface 25Ta of the thin-walled portion 25T of the focus ring 25, for example, an interference waveform 56 based on an interference location B is detected. Since the interference location A corresponds to optical path lengths of the measurement light 50 to the bottom surface 25Tb of the thin-walled portion 25T and the reflection light 52b, and the interference location B corresponds to optical path lengths of the measurement light 50 to the top surface 25Ta of the thin-walled portion 25T and the reflection light 52a, a difference D between the interference locations A and B corresponds to an optical path length of a low-coherence light (a part of the measurement light 50 and the reflection light 52a) that moves back and forth in a thickness direction within the thin-walled portion 25T of the focus ring 25. Since the optical path length of the low-coherence light that moves back and forth in the thickness direction within the thin-walled portion 25T corresponds to a thickness of the thin-walled portion 25T, the difference D of the interference locations A and B corresponds to the thickness of the thin-walled portion 25T. In other words, the thickness of the focus ring 25 may be measured by detecting the interference waveforms of the reflection light 54 and reflection light 52b and of the reflection light 54 and reflection light 52a.

Here, since the thickness of the focus ring 25 changes when the temperature of the focus ring 25 is changed, the thickness of the thin-walled portion 25T constituting a part of the focus ring 25 is also changed, and the optical path lengths of the measurement light 50 to the top surface 25Ta of the thin-walled portion 25T and the reflection light 52a are changed. In other words, when the temperature of the focus ring 25 is changed, the thickness of the thin-walled portion 25T is changed, and thus the interference location B of the reflection light 54 and the reflection light 52a is changed from the interference location B shown in FIG. 4A. In detail, the interference location B of FIG. 4A is moved to an interference location B' shown in FIG. 4B. Accordingly, a changed amount of the difference D of the interference locations A and B corresponds to an expansion amount accompanied by the temperature change of the focus ring 25. The member temperature measuring apparatus 33 obtains the temperature change from a pre-determined reference temperature of the focus ring 25 based on the changed amount of the difference D of the interference locations A and B, and calculates a detected temperature based on the temperature change and the reference temperature.

Next, a component in a processing chamber of a substrate processing apparatus and a method of measuring a temperature of the component, according to embodiments of the present invention, are described.

Figure 5A:
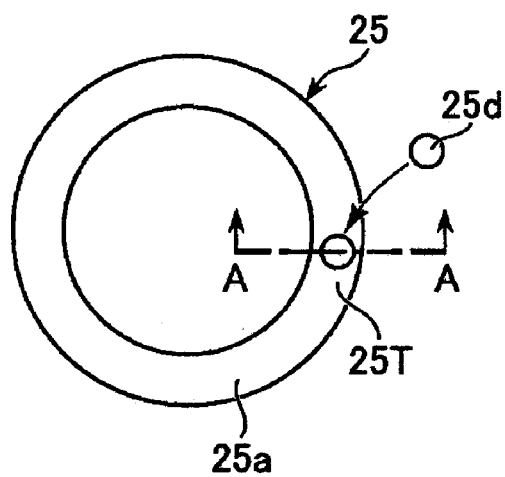
Figure 5B:
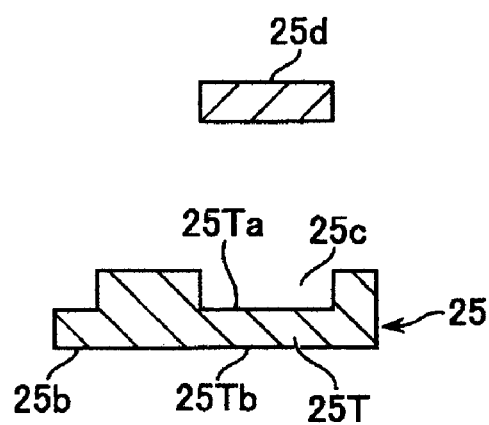
Figure 5C:
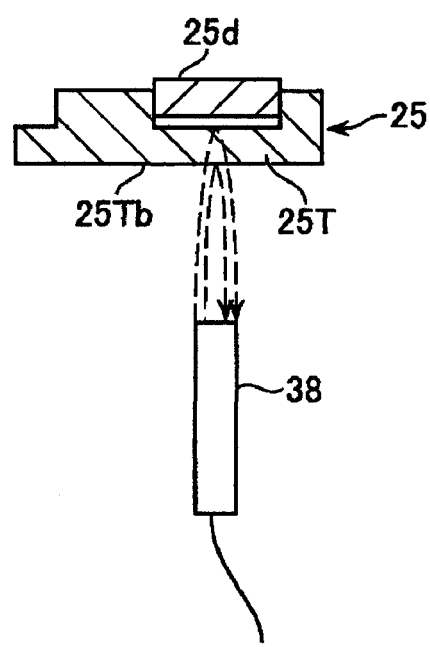

FIGS. 5A through 5C are views schematically showing a configuration of the focus ring 25 according to a first embodiment of the present invention, wherein FIG. 5A is a plan view, FIG. 5B is a cross-sectional view taken along a line A-A of FIG. 5A, and FIG. 5C is a cross-sectional view of a coating member 25d inserted onto the thin-walled portion 25T.

Referring to FIGS. 5A through 5C, the focus ring 25 includes the thin-walled portion 25T as a temperature measured portion. The thin-walled portion 25T is a thin-walled portion corresponding to a concave portion 25c formed on the top surface 25a of the focus ring 25 exposed to an abrasive atmosphere in an upper space (the processing chamber 15) of the chamber 11, and forms a part of the focus ring 25. The top surface 25Ta and the bottom surface 25Tb of the thin-walled portion 25T are parallel to each other, and a mirror-like finishing is performed on each of the top and bottom surfaces 25Ta and 25Tb. Also, the thin-walled portion 25T is of a constituent material of the focus ring 25 since the thin-walled portion 25T is a part of the focus ring 25. For example, the thin-walled portion 25T is formed of silicon (Si), and allows a low-coherence light constituting a measurement light to penetrate therethrough. Accordingly, the thin-walled portion 25T is suitable as a temperature measured portion using a low-coherence light.

The thin-walled portion 25T includes the coating member 25d coating the top surface 25Ta thereof (refer to FIG. 5C). Accordingly, the top surface 25Ta is protected from an abrasive atmosphere with plasma. The coating member 25d is formed of, for example, any one of silicon (Si), silicon carbide (SiC), quartz, sapphire, ceramic, alumina ($Al_2O_3$), and aluminum nitride (AlN), and a thickness thereof is not specifically limited as long as the top surface 25Ta of the thin-walled portion 25T is protected from being worn away.

Next, a method of measuring a temperature of the focus ring 25 by using the member temperature measuring apparatus 33 of FIG. 2 will be described.

According to the method of the present embodiment, a low-coherence light is irradiated perpendicularly from the collimator 38 to the bottom surface 25Tb of the thin-walled portion 25T of the focus ring 25, and reflection lights of the low-coherence light are received from the bottom surface 25Tb and the top surface 25Ta (refer to FIG. 5C). Also, a low-coherence light is perpendicularly irradiated from the collimator 39 to the reference mirror 42, and a reflection light from the reflection mirror 42 is received (refer to FIG. 2).

Here, when interference waveforms between the two reflection lights from the thin-walled portion 25T and the reflection light 54 from the reference mirror 42 are observed, the interference waveform 55 generated as the reflection light 54 from the reference mirror 42 interferes with the reflection light 52b from the bottom surface 25Tb of the thin-walled portion 25T, and the interference waveform 56 generated as the reflection light 54 from the reference mirror 42 interferes with the reflection light 52a from the top surface 25Ta of the thin-walled portion 25T are detected as described above with reference to FIGS. 4A and 4B. The changed amount of the difference D between the interference location A of the interference waveform 55 and the interference location B of the interference waveform 56 corresponds to the expansion amount of the thin-walled portion 25T in the thickness direction accompanied by the temperature change of the thin-walled portion 25T. Accordingly, the temperature of the thin-walled portion 25T, and furthermore, the temperature of the focus ring 25, may be calculated based on a correlation between the expansion amount and the temperature change.

According to the present embodiment, since the focus ring 25 having the abrasive surface (top surface 25a) exposed to an abrasive atmosphere and the nonabrasive surface (bottom surface 25b) not exposed to the abrasive atmosphere includes the thin-walled portion 25T having the top surface 25Ta and the bottom surface 25Tb parallel to each other, and the coating member 25d coating the top surface 25Ta of the thin-walled portion 25T, the temperature of the thin-walled portion 25T, and furthermore, the temperature of the focus ring 25, may be accurately measured without an effect of abrasion, by irradiating a low-coherence light to the thin-walled portion 25T covered by the coating member 25d and thus is not worn away.

In the present embodiment, a surface roughening process may be performed on a surface of the coating member 25d facing the top surface 25Ta of the thin-walled portion 25T. Accordingly, a low-coherence light that reached the coating member 25d through the focus ring 25 is diffused-reflected at the coating member 25d, and thus the PD 40 of the member temperature measuring apparatus 33 does not receive a reflection light from the coating member 25d. As a result, a reflection light is prevented from being unnecessarily received, thereby improving measurement precision. The surface roughening process is performed via, for example, a sandblast method. Here, a surface roughness of the surface of the coating member 25d facing the thin-walled portion 25T, which has been surface-roughened, may be, for example, equal to or more than ¼ of a wavelength of a low-coherence light, i.e., equal to or more than 0.27 μm (equal to or more than ¼ of 1.05 μm). Accordingly, diffused reflection of a low-coherence light may be increased to prevent a measurement error. A light reflection preventing film may be adhered instead of performing the surface roughening process.

In the present embodiment, a heat transfer sheet may be disposed on an attached surface of the coating member 25d and the concave portion 25c. Accordingly, continuity of the temperature of the focus ring 25 may be maintained, and an adverse effect caused as the coating member 25d is not thermally adhered to an inner wall surface of the concave portion 25c, for example, deterioration of measurement precision, may be prevented.

In the present embodiment, a diameter of the thin-walled portion 25T as a temperature measured portion, i.e., an opening diameter of the concave portion 25c, is, for example, equal to or more than 1 mm φ. The diameter of the thin-walled portion 25T is not limited as long as an area of the thin-walled portion 25T can have a spot of an irradiated light pass therethrough, and a size of the coating member 25d may be a size for protecting the thin-walled portion 25T as a temperature measured portion from an abrasive atmosphere with plasma.

In the present embodiment, the thickness of the thin-walled portion 25T defined by the top surface 25Ta and the bottom surface 25Tb of the thin-walled portion 25T may be equal to or more than 50 μm. Accordingly, overlapping of an interference waveform based on a reflection light from the top surface 25Ta of the thin-walled portion 25T and an interference waveform based on a reflection light from the bottom surface 25Tb is prevented, and thus measurement precision is improved. Since a coherence length of a low-coherence light used in the present embodiment is 50 μm, if the thickness of the thin-walled portion 25T, where a mirror-like finishing is performed on both of the top surface 25Ta and the bottom surface 25Tb, is lower than 50 μm, it is difficult to identify the reflection light from the top surface 25Ta of the thin-walled portion 25T and the reflection light from the bottom surface 25Tb, and thus measurement precision may be deteriorated.

In the present embodiment, a focus ring is applied as a component in a processing chamber of a substrate processing apparatus, but the component in the processing chamber may be, for example, an upper electrode, a lower electrode, an electrode protecting member, an insulator, an insulation ring, an observation window, a bellows cover, a baffle plate, or a deposhield, besides the focus ring.

In the present embodiment, the thin-walled portion 25T is formed as a temperature measured portion, but instead of forming a thin-walled portion, a part of the abrasive surface (top surface 25a) of the focus ring 25 may be a temperature measured portion, a part of a front surface and a rear surface of the focus ring 25 may be formed to be parallel to each other while performing a mirror-like finishing thereto, and a cover member covering the part of the abrasive surface (top surface 25a) may be formed.

Figure 6:
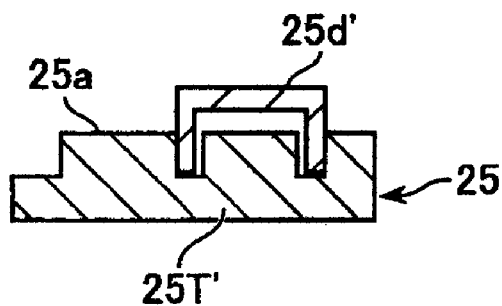
FIG. 6 is a cross-sectional view schematically showing a configuration of a focus ring according to a modified example of the first embodiment.

FIG. 6 is a cross-sectional view schematically showing a structure of the focus ring 25 according to a modified example of the first embodiment. In FIG. 6, a temperature measured portion 25T' is a part of the focus ring 25, and is covered by a coating member 25d'.

In the modified example of the present embodiment, a low-coherence light is perpendicularly irradiated to a bottom surface of the temperature measured portion 25T' like in the embodiment of FIG. 5, and a temperature is measured in the same manner, and thus the same effect may be obtained. Also, in the modified example of the present embodiment, a thickness of the temperature measured portion 25T' may be equal to or more than 50 μm. Accordingly, overlapping of an interference waveform based on a reflection light from a top surface of the temperature measured portion 25T' and an interference waveform based on a reflection light from the bottom surface is prevented, and thus accurate temperature measurement is possible.

Next, a second embodiment of the present invention will be described.

Figure 7:
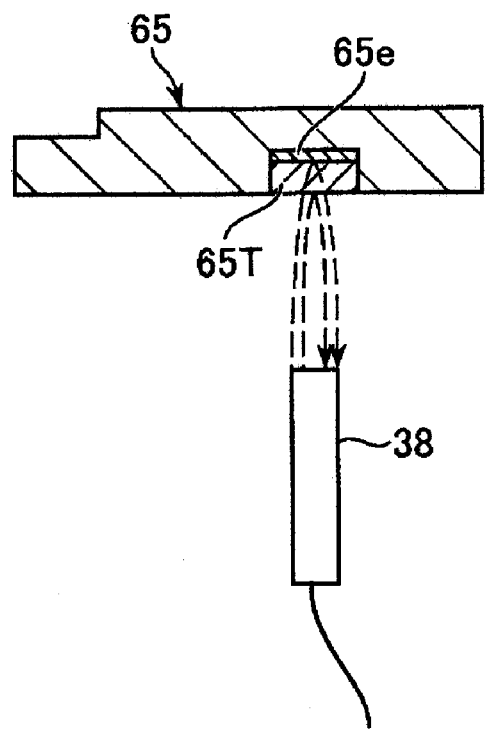
FIG. 7 is a cross-sectional view schematically showing a configuration of a focus ring according to a second embodiment of the present invention.

FIG. 7 is a cross-sectional view schematically showing a structure of a focus ring 65 according to a second embodiment of the present invention. In the focus ring 65, a temperature measured member 65T is buried in a body of the focus ring 65, and is covered by a part of the focus ring 65, and thus is protected from an abrasive atmosphere with plasma.

Referring to FIG. 7, the focus ring 65 is formed of, for example, silicon carbide (SiC), and the temperature measured member 65T is buried in a concave portion formed on a bottom surface. The temperature measured member 65T is formed of, for example, silicon (Si), quartz, or sapphire, has parallel top and bottom surfaces, and is mirror-like finished. A thickness of the temperature measured member 65T is, for example, equal to or more than 50 μm. When the thickness is lower than 50 μm, an interference waveform based on a reflection light from the top surface and an interference waveform based on a reflection light from the bottom surface overlap each other, and thus a difference between interference locations of the two interference waveforms becomes unclear, thereby increasing an error. A heat transfer sheet 65e is disposed on a contact portion of the top surface of the temperature measured member 65T and an inner surface of the concave portion of the focus ring 65, and thus thermal integration may be promoted.

Like in the above embodiment, temperature measurement of the focus ring 65 having such a configuration is performed by irradiating a low-coherence light from the collimator 38 perpendicularly to the temperature measured member 65T buried in the focus ring 65, receiving reflection lights from the top and bottom surfaces of the temperature measured member 65T, obtaining a temperature of the temperature measured member 65T like in the above embodiment, and determining the temperature of the temperature measured member 65T via the temperature of the focus ring 65.

According to the present embodiment, since the temperature measured member 65T formed of translucent Si is buried in the focus ring 65 and operates as a temperature measured portion, where the temperature measured member 65T has parallel top and bottom surfaces to which a mirror-like finishing is performed, an accurate temperature may be measured even if the focus ring 65 has been worn away. In other words, since the temperature measured member 65T is buried in the bottom surface of the focus ring 65, the top surface of the temperature measured member 65T is covered by the focus ring 65. Accordingly, a degree of parallelization of the top and bottom surfaces of the temperature measured member 65T is maintained without an effect of abrasion, and thus accurate temperature measurement is possible.

In the present embodiment, the heat transfer sheet 65e may be disposed on an entire contact surface of the temperature measured member 65T and a wall surface of the concave portion of the focus ring 65. Accordingly, thermal integration of the temperature measured member 65T and the focus ring 65 is improved, and thus accurate temperature measurement is possible.

Alternatively, instead of forming the heat transfer sheet 65e, a gas path may be formed in the focus ring 65, and a heat transfer gas, for example, helium (He) gas, may be distributed to the contact portion of the focus ring 65 and the temperature measured member 65T. At this time, thermal integration of the temperature measured member 65T and the focus ring 65 may be also obtained.

Next, a modified example of the second embodiment will be described.

Figure 8:
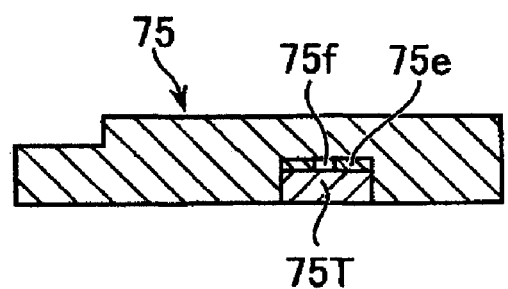
FIG. 8 is a cross-sectional view schematically showing a configuration of a focus ring according to a modified example of the second embodiment.

FIG. 8 is a cross-sectional view schematically showing a structure of a focus ring 75 according to a modified example of the second embodiment.

In FIG. 8, the focus ring 75 is different from the focus ring 65 of FIG. 7 in that the focus ring 75 is formed of silicon (Si), and a light penetration gap 75f is formed on a part of a heat transfer sheet 75e disposed on a contact surface of a top surface of a temperature measured member 75T and an inner surface of a concave portion of the focus ring 75.

In the focus ring 75 having such a configuration, temperature measurement is performed like in the above embodiments, and a low-coherence light is irradiated toward the light penetration gap 75f.

In the modified example of the present embodiment, a temperature of the focus ring 75 formed of silicon may be accurately measured without an effect of abrasion. Also, by forming the light penetration gap 75f on the heat transfer sheet 75e, abrasion of the focus ring 75 may be monitored.

Next, a third embodiment of the present invention will be described.

Figure 9:
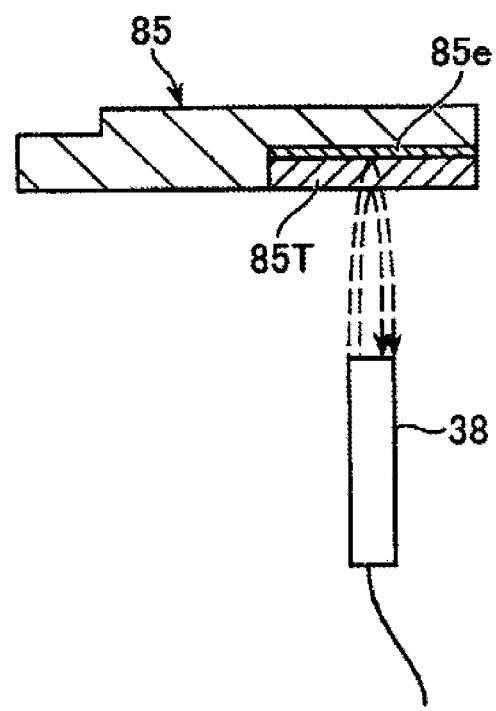
FIG. 9 is a cross-sectional view schematically showing a configuration of a focus ring according to a third embodiment of the present invention.

FIG. 9 is a cross-sectional view schematically showing a configuration of a focus ring 85 according to a third embodiment of the present invention.

In FIG. 9, the focus ring 85 is formed by attaching a temperature measured member 85T formed of silicon (Si) on about half of a bottom surface of the focus ring 85 formed of silicon carbide (SiC) via a heat transfer sheet 85e. The temperature measured member 85T has a circle shape concentric with an outer peripheral portion of the focus ring 85, along the outer peripheral portion.

Like each embodiment described above, temperature measurement of the focus ring 85 having such a configuration is performed by irradiating a low-coherence light to the temperature measured member 85T from the collimator 38.

In the present embodiment, since the temperature measured member 85T is covered by the focus ring 85, a temperature of the focus ring 85 may be accurately measured without an effect of abrasion.

Next, a modified example of the present embodiment will be described.

Figure 10:
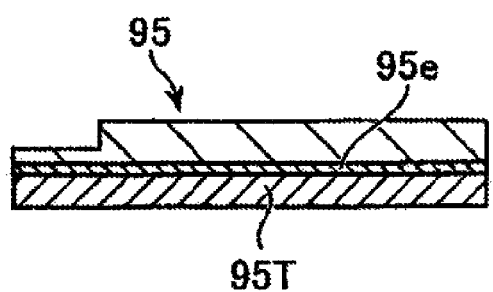
FIG. 10 is a cross-sectional view schematically showing a configuration of a focus ring according to a modified example of the third embodiment.

FIG. 10 is a cross-sectional view schematically showing a configuration of a focus ring 95 according to a modified example of the third embodiment.

In FIG. 10, the focus ring 95 is different from the focus ring 85 of FIG. 9 in that a temperature measured member 95T is formed on an entire bottom surface of the focus ring 95.

In the modified example of the present embodiment, since the temperature measured member 95T is covered by the focus ring 95 like in the above embodiments, a temperature of the focus ring 95 may be accurately measured without an effect of abrasion.

Next, a fourth embodiment of the present invention will be described.

Figure 11:
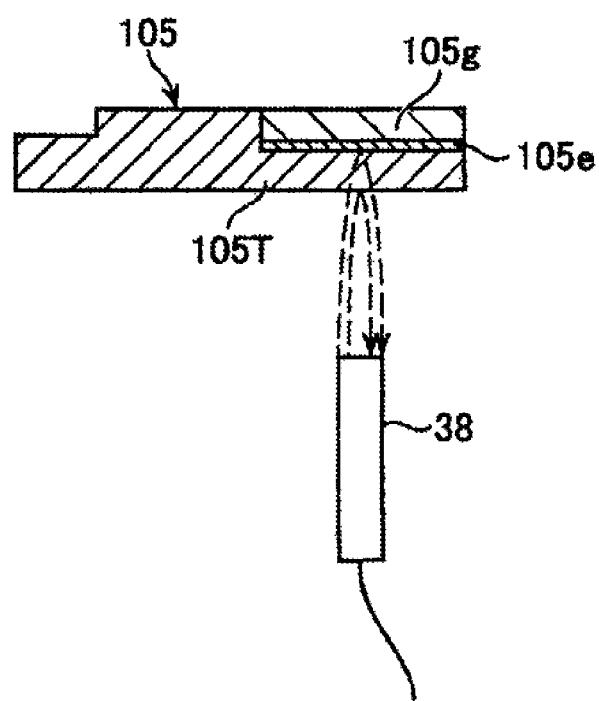
FIG. 11 is a cross-sectional view schematically showing a configuration of a focus ring according to a fourth embodiment of the present invention.

FIG. 11 is a cross-sectional view schematically showing a configuration of a focus ring 105 according to a fourth embodiment of the present invention.

According to FIG. 11, in the focus ring 105, an upper outer peripheral portion that is easily worn away is formed of a material having high plasma tolerance, for example, silicon carbide (SiC), and other portions are formed of, for example, silicon (Si). In other words, the focus ring 105 includes a silicon carbide layer 105g forming the upper outer peripheral portion that is easily worn away, and a silicon layer 105T forming the other portions, wherein a heat transfer sheet 105e is disposed on an attached surface thereof. The silicon layer 105T as a bottom surface coated by the silicon carbide layer 105g as a top surface becomes a temperature measured portion.

Temperature measurement of the focus ring 105 having such a configuration is performed by, like in each embodiment described above, irradiating a low-coherence light to the silicon layer 105T from the collimator 38.

In the present embodiment, a temperature of the focus ring 105 may be accurately measured without an effect of abrasion, like in each of the above embodiments.

Next, a modified example of the present embodiment will be described.

Figure 12:
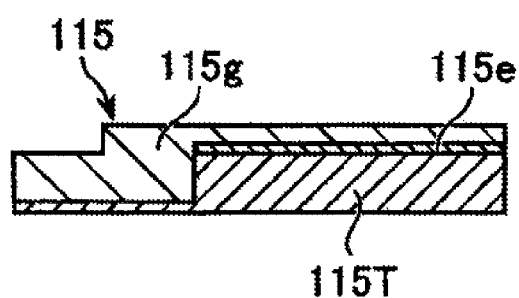
FIG. 12 is a cross-sectional view schematically showing a configuration of a focus ring according to a modified example of the fourth embodiment.

FIG. 12 is a cross-sectional view schematically showing a configuration of a focus ring 115 according to a modified example of the fourth embodiment.

In FIG. 12, the focus ring 115 is used when an inner peripheral portion is easily worn away. A layer formed of a material having high plasma tolerance, for example, a silicon carbide layer 115g, is disposed mainly on an inner peripheral portion of a top surface of the focus ring 115, and other portions are formed of a silicon layer 115T. The silicon layer 115T as a bottom surface coated by the silicon carbide layer 115g as a top surface becomes a temperature measured portion.

According to the modified example of the present embodiment, a temperature of the focus ring 115 may be accurately measured without an effect of abrasion, like in the above embodiments.

According to the present invention, a temperature of a component in a processing chamber can be accurately measured by using a temperature measuring apparatus using an interference of low-coherence light even if a front surface and a rear surface of the component is no longer parallel due to abrasion or the like, because a measurement light is irradiated to a surface of a temperature measured portion at a nonabrasive surface side, where the temperature measured portion includes the surface at the nonabrasive surface side and a surface at an abrasive surface side, which is not worn away by being coated by a coating portion, and a temperature of the temperature measured portion is obtained based on an optical path length difference of two reflection lights reflected from the surface at the nonabrasive surface side and the surface at the abrasive surface.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A component in a processing chamber of a substrate processing apparatus, wherein a temperature of the component is measured, the component comprising:
   an abrasive surface which is exposed to an abrasive atmosphere and a nonabrasive surface which is not exposed to the abrasive atmosphere;
   a temperature measured portion including a surface at the abrasive surface side and a surface at the nonabrasive surface side, which are parallel to each other; and
   a coating portion which coats the surface of the temperature measured portion at the abrasive surface side,
   wherein the temperature measured portion is a thin-walled portion corresponding to a concave portion formed on the abrasive surface, and a mirror surface finishing is performed on each of a surface of the thin-walled portion at the abrasive surface side and a surface of the thin-walled portion at the nonabrasive surface side.

2. The component of claim 1, wherein a surface roughening process is performed on a surface of the coating portion facing the surface of the thin-walled portion at the abrasive surface side.

3. The component of claim 1, wherein a heat transfer sheet or a heat transfer gas is disposed at a contact portion of the coating portion and an inner surface of the concave portion.

4. The component of claim 1, wherein the coating portion is formed of any one of silicon (Si), silicon carbide (SiC), quartz, sapphire, ceramic, alumina ($Al_2O_3$), and aluminum nitride (AlN).

5. The component of claim 1, wherein the component in the processing chamber of the substrate processing apparatus is any one of a focus ring, an upper electrode, a lower electrode, an electrode protecting member, an insulator, an insulation ring, an observation window, a bellows cover, a baffle plate, and a deposhield.

6. A component in a processing chamber of a substrate processing apparatus, wherein a temperature of the component is measured, the component comprising:
   an abrasive surface which is exposed to an abrasive atmosphere and a nonabrasive surface which is not exposed to the abrasive atmosphere;
   a temperature measured portion including a surface at the abrasive surface side and a surface at the nonabrasive surface side, which are parallel to each other; and
   a coating portion which coats the surface of the temperature measured portion at the abrasive surface side,
   wherein the temperature measured portion is a temperature measured member inserted to a concave portion formed on the nonabrasive surface of the component in the processing chamber of the substrate processing apparatus,
   wherein a mirror surface finishing is performed on each of a surface of the temperature measured member at the abrasive surface side and a surface of the temperature measured member at the nonabrasive surface side.

7. The component of claim 6, wherein a surface roughening process is performed on an inner surface of the concave portion facing the surface of the temperature measured member at the abrasive surface side.

8. The component of claim 6, wherein a heat transfer sheet or a heat transfer gas is disposed at a contact portion of the temperature measured member and the inner surface of the concave portion.

9. The component of claim 6, wherein the temperature measured member is formed of silicon (Si), quartz, or sapphire.

10. A component in a processing chamber of a substrate processing apparatus, wherein a temperature of the component is measured, the component comprising:
    an abrasive surface which is exposed to an abrasive atmosphere and a nonabrasive surface which is not exposed to the abrasive atmosphere;
    a temperature measured portion including a surface at the abrasive surface side and a surface at the nonabrasive surface side, which are parallel to each other; and
    a coating portion which coats the surface of the temperature measured portion at the abrasive surface side,
    wherein the temperature measured portion is a part of the component in the processing chamber of the substrate processing apparatus, a mirror surface finishing is performed on each of the surface at the abrasive surface side and the surface at the nonabrasive surface side with respect to the part of the component in the processing chamber of the substrate processing apparatus, and the surface at the abrasive surface side, on which the mirror surface finishing is performed, is covered by the coating portion.

11. A component in a processing chamber of a substrate processing apparatus, wherein a temperature of the component is measured, the component comprising:
    an abrasive surface which is exposed to an abrasive atmosphere and a nonabrasive surface which is not exposed to the abrasive atmosphere;

a temperature measured portion including a surface at the abrasive surface side and a surface at the nonabrasive surface side, which are parallel to each other; and a coating portion which coats the surface of the temperature measured portion at the abrasive surface side, wherein the temperature measured portion is a temperature measured member inserted to a cut-out portion formed on the nonabrasive surface of the component in the processing chamber of the substrate processing apparatus, a mirror surface finishing is performed on each of the surface of the temperature measured member at the abrasive surface side and the surface of the temperature measured member at the nonabrasive surface side, and the surface of the temperature measured member at the abrasive surface side is covered by a part forming the cut-out portion of the component in the processing chamber of the substrate processing apparatus.

12. A component in a processing chamber of a substrate processing apparatus, wherein a temperature of the component is measured, the component comprising:

an abrasive surface which is exposed to an abrasive atmosphere and a nonabrasive surface which is not exposed to the abrasive atmosphere;

a temperature measured portion including a surface at the abrasive surface side and a surface at the nonabrasive surface side, which are parallel to each other; and a coating portion which coats the surface of the temperature measured portion at the abrasive surface side, wherein the temperature measured portion is a temperature measured member attached to the nonabrasive surface of the component in the processing chamber of the substrate processing apparatus, a mirror surface finishing is performed on each of the surface of the temperature measured member at the abrasive surface side and the surface of the temperature measured member at the nonabrasive surface side, and the surface of the temperature measured member at the abrasive surface side is covered by the component in the processing chamber of the substrate processing apparatus.

13. The component of claim 12, wherein the temperature measured member has a stepped portion comprising a thick plate portion and a thin plate portion, a surface of the thin plate portion at the abrasive surface side and a surface of the thin plate portion at the nonabrasive surface side are parallel to each other, a mirror surface finishing is performed on each of the surfaces of the thin plate portion, and the surface of the thin plate portion at the abrasive surface side is covered by a part of the component in the processing chamber of the substrate processing apparatus.

14. The component of claim 12, wherein the temperature measured member comprises a stepped portion comprising a thick plate portion and a thin plate portion, a surface of the thick plate portion at the abrasive surface side and a surface of the thick plate portion at the nonabrasive surface side are parallel to each other, a mirror surface finishing is performed on each of the surfaces of the thick plate portion, and the surface of the thick plate portion at the abrasive surface side is covered by a part of the component in the processing chamber of the substrate processing apparatus.

* * * * *